Jan. 11, 1966 R. EMEIS 3,228,104
METHOD OF ATTACHING AN ELECTRIC CONNECTION
TO A SEMICONDUCTOR DEVICE
Filed April 18, 1962
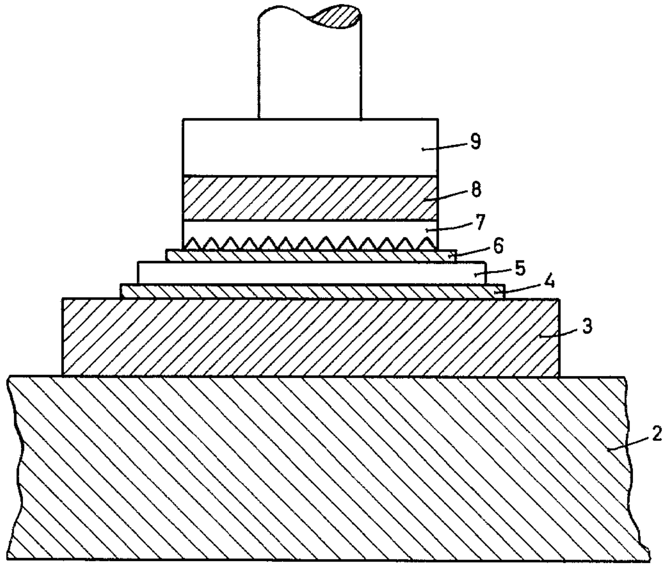

United States Patent Office 3,228,104 Patented Jan. 11, 1966

3,228,104

METHOD OF ATTACHING AN ELECTRIC CONNECTION TO A SEMICONDUCTOR DEVICE

Reimer Emeis, Ebermannstadt, Germany, assignor to Siemens-Schuckertwerke Aktiengesellschaft, Berlin-Siemensstadt, Germany, a corporation of Germany Filed Apr. 18, 1962, Ser. No. 188,509
Claims priority, application Germany, Apr. 19, 1961, S 73,551
9 Claims. (Cl. 29—482)

My invention relates to the manufacture of electronic semiconductor devices such as rectifiers, transistors, photodiodes, four-layer junction devices and the like, and concerns itself more particularly with a method for attaching an electric terminal or the like conducting member to a semiconductor element comprising a monocrystalline semiconductor body, for example of silicon, with one or more p-n junctions and at least one planar large-area electrode composed essentially of a gold-semiconductor eutectic.

Electronic semiconductor devices, as a rule, comprise a semiconductor body of essentially monocrystalline semiconductor materials such as germanium, silicon, silicon carbide, or also consisting of indium antimonide, gallium phosphide or another intermetallic compound formed of respective elements from the third and fifth groups of the periodic system of elements. This semiconductor body possesses different doped regions having respectively different degrees or types of conductance and has a large surface area intimately bonded by alloying or diffusion with an electrode consisting of the above mentioned eutectic gold-semiconductor composition.

There are several different methods for producing such semiconductor devices. Thus, it has become known to place foils of gold onto a semiconductor body in the shape of a circular disc or prism, and to alloy the gold by heating into the surface of the semiconductor body. In most cases the gold foils contain doping additions, for example acceptors on donors from the third and fifth groups respectively of the periodic system. For the production of contact electrodes that are to form an ohmic rather than a rectifying junction, a gold foil without doping additions is also sufficient.

When applying this method to semiconductor bodies of silicon and germanium, the process is carried out by heating the semiconductor body together with the gold foil placed thereupon, to a temperature about the eutectic temperature of the gold-semiconductor composition and thereafter permitting the resulting product to cool down to room temperature at a relatively slow rate. With this method a greater quantity of the semiconductor material than corresponds to the eutectic composition is melted. During the subsequent cooling, a portion of the molten semiconductor material recrystallizes first until ultimately the remaining residual melt freezes in eutectic composition. The recrystallization zone thus produced contains a portion of the alloying constituents of the gold and therefore possesses a doping which departs with respect to degree or conductance type from the doping of the basic material of the semiconductor body that passed unchanged through the process. The gold-semiconductor eutectic adjacent to the recrystallization zone generally serves as a contact electrode for the dope modified or conductance-reversed region of the semiconductor body.

The term gold-semiconductor eutectic is herein used as a eutectic of one of the two binary systems Au/Ge and Au/Si. These eutectics can also be used as contact metal for intermetallic semiconductor compounds or silicon carbide.

The electrical leads or terminals, as a rule, are attached to the semiconductor devices by alloying or soldering. When soldering connecting components to such a contact electrode there exists the danger of contaminating the semiconductor surface by solder vapors and other impurities. When alloying connecting parts together with such contact electrodes, the eutectic, as a rule, is again melted by a heating process, thus subjecting the semiconductor device to another thermal stress at least up to the eutectic temperature (about 370° C.).

It is an object of my invention to provide a novel method of attaching an electric connection to a eutectic electrode on a semiconductor body that eliminates the above-mentioned difficulties. More particularly, it is an object of my invention to prevent melting of the eutectic gold-semiconductor alloy once it has been properly produced on the semiconductor body to form an electrode thereof, thus avoiding the danger of contamination and undesirable modification of properties by subsequent attachment of conducting leads or terminals.

It is also an object of my invention to simplify the production of semiconductor devices with respect to the attachment of conducting parts to the above-mentioned electrodes, and to make such production more suitable for mass-quantity manufacture by lowering the temperature to be used for the attaching operation.

To achieve these objects, and in accordance with a feature of my invention, a connecting part consisting of a metal from the group gold, silver and copper or coated with such metal is placed upon the eutectic contact electrode in large-area face-to-face relation thereto. The assembly is then heated with applicational pressure to a temperature of approximately 250° C. The heating preferably performed for a period of one full day (about 24 hours). It is of advantage to pass electric current through the semiconductor device while the heating operation is being performed. However, the heating can also be effected by passing electric current only through the semiconductor device.

The invention will be further described with reference to an example corresponding to the embodiment of a rectifier device shown in section on the accompanying drawing. The semiconductor device is fastened on a plate or sheet 2 which serves as a heat sink or forms part of a cooling device. The sheet 2 has relatively large thickness in comparison with the other components still to be described and consists of a good heat conducting material, for example, copper. The rectifier device can be produced for example in the following manner.

An aluminum disc of about 19 mm. diameter is placed upon a molybdenum disc of about 22 mm. diameter. On top of the aluminum disc, a plate of p-type silicon having a specific resistance of about 1000 ohm-cm. and a diameter of about 18 mm. is placed. A gold-antimony foil of a somewhat smaller diameter, for example 14 mm., than the silicon disc is placed thereon. The entire assembly is pressed into a refractory powder of material which does not react with the materials of the assembly. Graphite, for example, is suitable as such imbedding powder. The imbedded assembly together with the imbedding powder is heated to a temperature of about 800° C. under sufficient pressure to hold the assembled components in intimate contact with each other. The heating can be performed for example in an alloying furnace which is evacuated or filled with a protective gas.

The rectifier element shown on the drawing constitutes the result of the alloying process. The molybdenum disc 3 is joined face-to-face with a silicon body 5 over a large contact area by an aluminum-silicon eutectic 4. Located at the top side of the silicon plate 5 is a contact electrode 6 consisting essentially of a gold-silicon eutectic. The molybdenum disc 3 can be fastened to the heat-sink sheet 2 in any known and suitable manner, for example by soldering, alloying or also only by being pressed mechanically against the sheet.

Pressed upon the other side of the semiconductor assembly is a plunger-like connecting part which is composed of several individual components.

In direct contact with gold-silicon eutectic 6 is component 7 consisting for example of a silver foil, which component can be fastened, for example by hard soldering on a component 8 consisting of molybdenum. The disc-shaped component 8, in turn, is in good heat conducting and electrically conducting large-area connection with a copper member 9, for example likewise by hard solder. The connection of the plunger components 7, 8 and 9 with each other is preferably made and completed prior to placing the entire plunger onto the semiconductor device.

Before doing this, the silver-foil component 7, forming the front face of the plunger is provided on its bottom surface with a raised pattern of ridges or the like projections, for example a waffle pattern or a knurled pattern similar to that employed on knurled knobs. It is preferable to thereafter slightly lap the surface of part 7 so that the individual contact areas of the raised pattern are all made to be located in a single plane. For example, the part 7 may be placed with its bottom side onto the lapping disc of a lapping machine and leave it there for about one-half to one minute. It is also preferable to slightly lap the topside of the gold semiconductor eutectic in order to also provide for a precisely planar contacting area. Thereafter the plunger-like connecting part is placed upon the semiconductor device as mentioned above, and a pressure is exerted upon the connecting part composed of components 7, 8 and 9, this pressure amounting up to a few hundred kg./cm.$^2$, preferably about 200 kg./cm. at the lower plunger surface. This pressure holds the surface of part 7 against the gold-silicon eutectic. While being kept in this pressed condition, the entire arrangement is heated to a temperature of about 250° C. This temperature is so far below the melting point of the gold-silicon eutectic, that no new melting of the eutectic takes place. Nevertheless, a very fast and strong bond is thus produced between the silver and the eutectic consisting predominantly of gold. This is presumably due to diffusion caused by prolonged effect of heat. It has been found that such an intimate bond is a very good heat conductance and electrical conductance. When tearing the bonded parts apart by excessive force, the destruction does not occur at the junction between the parts 6 and 7 but essentially along the bonding area between the parts 5 and 6.

We have found it preferable to perform the above-described heating operation while passing electric current through the semiconductor device. For example, the entire arrangement can be connected in an operative rectifier circuit and put under electric load in order to reach the desired processing temperature of approximately 250° C. This may require some amount of overloading of the device in comparison with the rated normal load. Consequently, when producing the electric connection in accordance with the invention, the heating need be effected only up to such temperatures which are to be expected during subsequent operation of the electronic semiconductor device. This facilitates the manufacture of such semiconductor devices to a considerable extent, particularly with respect to mass production.

While for use with silicon we have found a temperature of approximately 250° C. suitable, the desired result can also be obtained, with silicon or other semiconductor materials, when employing heating temperatures within the limits of about 180° to about 300° C. The lower the processing temperature, the longer the heating treatment must be continued. The upper limit of the temperature is given by the eutectic melting temperature because a new melting of the previously formed eutectic is to be avoided.

The contact pressure during a heating can be produced by means of spring pressure or screw bolts, for example. It has been found that this pressure is not detrimental when subsequently employing the finished semiconductor device in continuous operation. For that reason this pressure may also be maintained continuously after the semiconductor device is completed. For example, a semiconductor device can be encapsulated and parts of the capsule can then be designed as means for exerting continuous pressure. A subsequent treatment of the connection thus made, for example by etching or the like, is not necessary.

I claim:

1. The method of producing an electric connection for a semiconductor element having a monocrystalline semiconductor body with at least one p-n junction and a planar large-area contact electrode essentially of a eutectic gold-semiconductor composition joined with the body, which comprises the steps of placing into face-to-face area contact with the gold-semiconductor electrode a conductive member consisting at least at the contacting surface of metal from the group consisting of gold, silver and copper, and heating the resulting assembly under pressure, of about 100 to about 200 kg./cm.$^2$, to a temperature below the melting point of said eutectic composition and between 180° and 300° C. for a period of about 24 hours.

2. The method of producing an electric connection for a semiconductor element having a monocrystalline semiconductor body of silicon with at least one p-n junction and a planar large-area contact electrode essentially of eutectic gold-silicon composition joined with the body, which comprises the steps of placing into face-to-face area contact with the gold-silicon electrode a conductive member consisting at least at the contacting surface of metal from the group consisting of gold, silver and copper, and heating the resulting assembly under pressure, of about 100 to about 200 kg./cm.$^2$, to a temperature of about 250° C. for about a day.

3. The method of claim 1, which comprises the steps of providing said contacting surface of said conductive member with a raised pattern before joining said member with said electrode.

4. The method of claim 1, which comprises the steps of providing said contacting surface of said conductive member with a raised pattern and then slightly lapping the surface of said area and the top portion of said pattern on said member prior to placing the respective lapped surface in contact with each other.

5. The method of claim 1, which comprises maintaining the heating under pressure for a period of approximately one day.

6. The method of claim 1, which comprises the steps of passing electric current through the said assembly while the assembly is being heated.

7. The method according to claim 1, wherein said heating is produced only by passing electric current through said assembly.

8. The method of producing an electric connection for a semiconductor element having a monocrystalline semiconductor body of silicon with at least one p-n junction and a planar large-area contact electrode essentially of eutectic gold-silicon composition joined with the body, which comprises the steps of placing into face-to-face area contact with the gold-silicon electrode a conductive member consisting at least at the contacting surface of metal from the group consisting of gold, silver and copper and heating the resulting assembly at a temperature between 180° and 300° C. and a pressure of about 100 to about 200 kg./cm.$^2$ for a period of approximately one full day.

9. The method of producing an electric connection for a semiconductor element having a monocrystalline semiconductor body of silicon with at least one p-n junction and a planar large-area contact electrode essentially of eutectic gold-silicon composition joined with the body, which comprises the steps of providing a conductive member consisting at least at the contacting surface of metal from the group consisting of gold, silver and copper, said contacting surface of said conductive member having a raised pattern, slightly lapping said raised pattern and pressing said lapped conductive member into face-to-face area contact with the gold-silicon electrode and heating the resulting assembly at a temperature between 180° and 300° C. and pressure of about 100 to about 200 kg./cm.$^2$ for a period of approximately one full day.

References Cited by the Examiner

UNITED STATES PATENTS

| | | | |
|---|---|---|---|
| 1,155,426 | 10/1915 | Liebmann et al. | |
| 2,743,201 | 4/1946 | Johnson et al. | |
| 2,837,818 | 6/1958 | Storchheim | 29—504 X |
| 3,006,067 | 10/1961 | Anderson et al. | 29—498 X |

JOHN F. CAMPBELL, *Primary Examiner.*